US009722531B2

(12) United States Patent
Singh et al.

(10) Patent No.: US 9,722,531 B2
(45) Date of Patent: Aug. 1, 2017

(54) ELECTRONIC INVERTER ASSEMBLY WITH AN INTEGRAL SNUBBER CAPACITOR

(71) Applicant: Deere & Company, Moline, IL (US)

(72) Inventors: Brij N. Singh, West Fargo, ND (US); Christopher J. Schmit, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 0 days.

(21) Appl. No.: 15/248,255

(22) Filed: Aug. 26, 2016

(65) Prior Publication Data

US 2016/0365788 A1    Dec. 15, 2016

Related U.S. Application Data

(63) Continuation-in-part of application No. 14/720,035, filed on May 22, 2015, now Pat. No. 9,490,555.

(51) Int. Cl.
| | |
|---|---|
| H02P 29/02 | (2016.01) |
| H02P 27/06 | (2006.01) |
| B60L 11/18 | (2006.01) |
| H01R 24/48 | (2011.01) |
| H02M 1/34 | (2007.01) |
| H02M 7/00 | (2006.01) |

(52) U.S. Cl.
CPC .............. *H02P 29/02* (2013.01); *B60L 11/18* (2013.01); *H01R 24/48* (2013.01); *H02P 27/06* (2013.01); *H02M 7/003* (2013.01); *H02M 2001/348* (2013.01)

(58) Field of Classification Search
USPC ..... 439/78, 620.26; 361/784, 721, 328, 699; 363/144; 174/68.2
See application file for complete search history.

(56) References Cited

U.S. PATENT DOCUMENTS

| | | | |
|---|---|---|---|
| 6,262,876 B1 | 7/2001 | Schimanek | |
| 6,278,603 B1 | 8/2001 | Arbanas et al. | |
| 6,396,332 B2 | 5/2002 | Richardson | |
| 7,289,311 B2 | 10/2007 | Hosking | |
| 7,453,114 B2 | 11/2008 | Hosking | |
| 2012/0229977 A1 | 9/2012 | Hosking et al. | |

OTHER PUBLICATIONS

Jih-Sheng Lai; H. Kouns; J. Bond, A Low-Inductance DC Bus Capacitor for High Power Traction Motor Drive Inverters, Conference Record of the 2002 IEEE Industry Applications Conference. 37th IAS Annual Meeting (Cat. No. 02CH37344), 2002, vol. 2, pp. 955-962, vol. 2, DOI: 10.1109/IAS.2002.1042673.
A. Elbanhawy, Effect of source inductance on MOSFET rise and fall times [online], Application demonstration, Maplesoft. Mar. 2008, [retrieved on May 22, 2015]. Retrieved from the Internet < URL: http://citeseerx.ist.psu.edu/viewdoc/download?doi=10.1.1.575.543&rep=rep1&type=pdf>.

*Primary Examiner* — Alexander Gilman

(57) ABSTRACT

A coaxial bus connector has a first end and a second end opposite the first end. The first end has a first positive terminal and a first negative terminal coupled to a primary direct current bus of a primary inverter. The second end has a second positive terminal and a second negative terminal coupled to the secondary direct current bus of a secondary inverter, wherein the coaxial bus connector comprises a dielectric material between a center conductor and a coaxial sleeve to form a snubber capacitor to absorb electrical energy or to absorb voltage spikes.

11 Claims, 14 Drawing Sheets

US 9,722,531 B2

1

ELECTRONIC INVERTER ASSEMBLY WITH AN INTEGRAL SNUBBER CAPACITOR

RELATED APPLICATIONS

This is continuation-in-part of U.S. patent application Ser. No. 14/720,035, filed May 22, 2015 and hereby incorporates the above patent application by reference herein.

GOVERNMENT LICENSE RIGHTS

This invention was made with U.S. government support under contract or award DE-EE0006521.0001 awarded by U.S. Department of Energy. The U.S. government has certain rights in the invention.

FIELD OF DISCLOSURE

This invention relates to an electronic inverter assembly and more particularly to a compact electronic inverter assembly with an integral snubber capacitor.

BACKGROUND

Electronic inverters can be used to control motors or to convert alternating electric current to direct electric current. In certain background art in the electronic inverter, power semiconductor switches, such as silicon carbide (SiC) and gallium nitride (GaN) devices, can be operated at much higher temperature than conventional silicon semiconductors and, hence, generate heat flux that can reduce the longevity of certain electronic components that are proximately located to the semiconductor switches. Further, parasitic inductances can result in reduced longevity of semiconductor switches, reduced maximum switching speed and ripple current on the direct current bus. Accordingly, there is a need for compact electronic inverter assembly with an integral snubber capacitor.

SUMMARY

In accordance with one embodiment, a primary direct current bus has a positive terminal and a negative terminal. A primary inverter power module comprises one or more pairs of semiconductor switches mounted on a primary substrate. Each pair of semiconductors comprises a low-side semiconductor switch and a high-side semiconductor switch coupled together between the primary direct current bus. Each of the semiconductor switches comprises a control terminal and switched terminals. A secondary direct current bus has a positive terminal and a negative terminal. A secondary inverter power module comprises one or more pairs of semiconductor switches mounted on a secondary substrate. Each pair of semiconductors comprises a low-side semiconductor switch and a high-side semiconductor switch coupled together between the secondary direct current bus. Each of the semiconductor switches comprises a control terminal and switched terminals. A coaxial bus connector has a first end and a second end opposite the first end. The first end has a first positive terminal and a first negative terminal coupled the primary direct current bus. The second end has a second positive terminal and a second negative terminal coupled to the secondary direct current bus, wherein the coaxial bus connector comprises a dielectric material between a center conductor and a coaxial sleeve to form a snubber capacitor to absorb electrical energy or to absorb voltage spikes.

BRIEF DESCRIPTION OF THE DRAWINGS

In any group of two or more drawings, like reference numbers indicate like elements or features.

DETAILED DESCRIPTION

Figure 1:
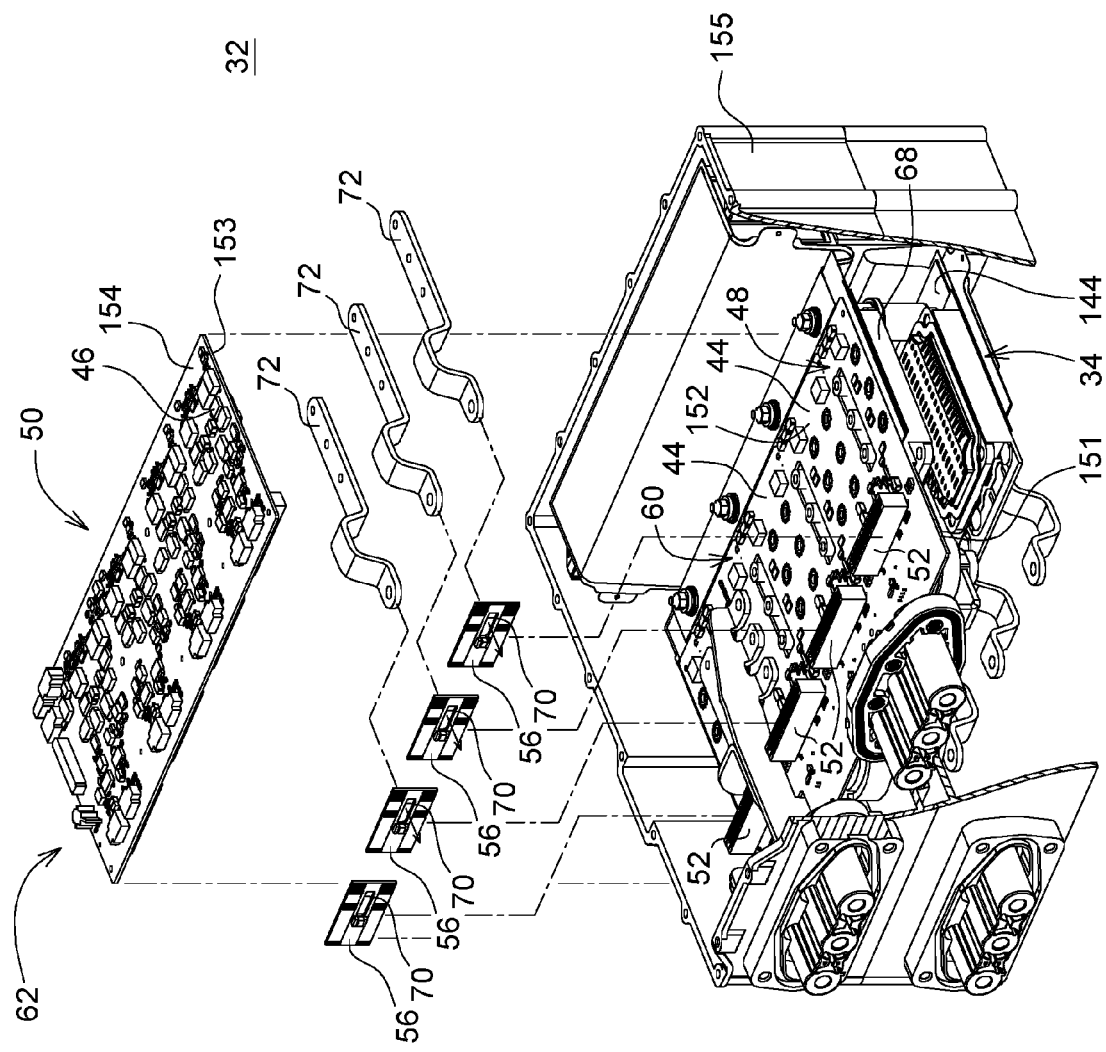
FIG. 1 is an exploded perspective view of one embodiment of the electronic inverter assembly.

In accordance with one embodiment, an electronic inverter assembly 32 comprises an inverter power module 34. The inverter power module may comprise one or more switch modules 68. Each switch module 68 comprises one or more pairs of semiconductor switches mounted on a substrate. Each pair of semiconductors comprises a low-side semiconductor switch 36 and a high-side semiconductor switch 38. The semiconductor switches could be made of silicon carbide (SiC), gallium nitride (GaN), or any wide-bandgap semiconductor material. For example, the semiconductor switches could be any of the following types of power transistors: metal oxide semiconductor field effect transistor (MOSFET), insulated gate bipolar junction transistor (IGBT), bipolar junction transistors (BJT), and the like. Each of the semiconductor switches comprises a control terminal 40 and switched terminals 42.

A first circuit board 44 has an outer side 151 adjacent to or that faces the inverter power module 34 and a first inner side 152 opposite the outer side 151. A first driver portion 48 comprises a set of first components 60 mounted on or associated with the first circuit board 44. A second circuit board 46 is spaced apart from the first circuit board 44. The second circuit board 46 has a second inner side 153 facing the first inner side 152. A second outer side 154 of the second circuit board 46 is opposite the second inner side 153. A second driver portion 50 comprises a set of second components 62 mounted on or associated with the second circuit board 46, where the first driver portion 48 and the second driver portion 50 collectively are adapted to provide input signals to the control terminal 40 of each semiconductor switch.

A first edge connector 52 is mounted on the first inner side 152 of the first circuit board 44. A second edge connector 54 is mounted on the second inner side 153 of the second circuit board 46. An interface board 56 with mating edges 58 that mate with corresponding receptacles or slots in the first edge connector 52 and the second edge connector 54.

In one embodiment, the first components 60 comprises driver circuit components with higher temperature operating ranges than the second components 62. For example, the first components 60 have a first temperature operating range of greater than or approximately equal to 150 degrees Celsius. Similarly, the second components 62 comprise driver circuit components with a second temperature operating range of between approximately 125 degrees Celsius and approximately 150 degrees Celsius. Accordingly, the first circuit board 44 may be reserved for population by first components 60 with a higher temperature operating range than the second components 62 of the second circuit board 46.

The driver comprises the first driver portion 48 and the second driver portion 50. The first driver portion 48 comprises the first circuit board 44 and the first components 60, whereas the second driver portion 50 comprises the second circuit board 46 and the second components 62. Collectively, the first driver portion 48 and the second driver portion 50 form a driver circuit (e.g., low inductance driver circuit) via one or more interface boards 56 for providing control signals to the inverter or control terminals 40 (e.g., gates or bases) of the semiconductor switches of the switch modules 68.

A set of first edge connectors 52 are mounted on the first inner side 152 of the first circuit board 44. A set of second edge connectors 54 are mounted on the second inner side 153 of the second circuit board 46. In one embodiment, each first edge connector 52 and each second edge connector 54 may comprise a surface mount card edge connector, such as those that are available through Sullins Connector Solutions of San Marcos, Calif.

Each interface board 56 has mating edges 58 that mate with a corresponding one of the first edge connector 52 and a corresponding one of the second edge connector 54. For example, the mating edges 58 mate with corresponding slots or receptacles in the connectors (52, 54). Each interface board 56 and its corresponding edge connectors supports a suitable or low inductance signal path for electrical signals of the driver circuit (58, 50) that are communicated between the first board 44 and the second board 46, or between the first board 44 and the control terminal 40 of the respective semiconductor switch (36, 38) of the switching module 68 of the inverter, or between the second board 46 and the control terminal 40 of the respective semiconductor switch (36, 38) of the switching module 68 of the inverter.

Figure 4:
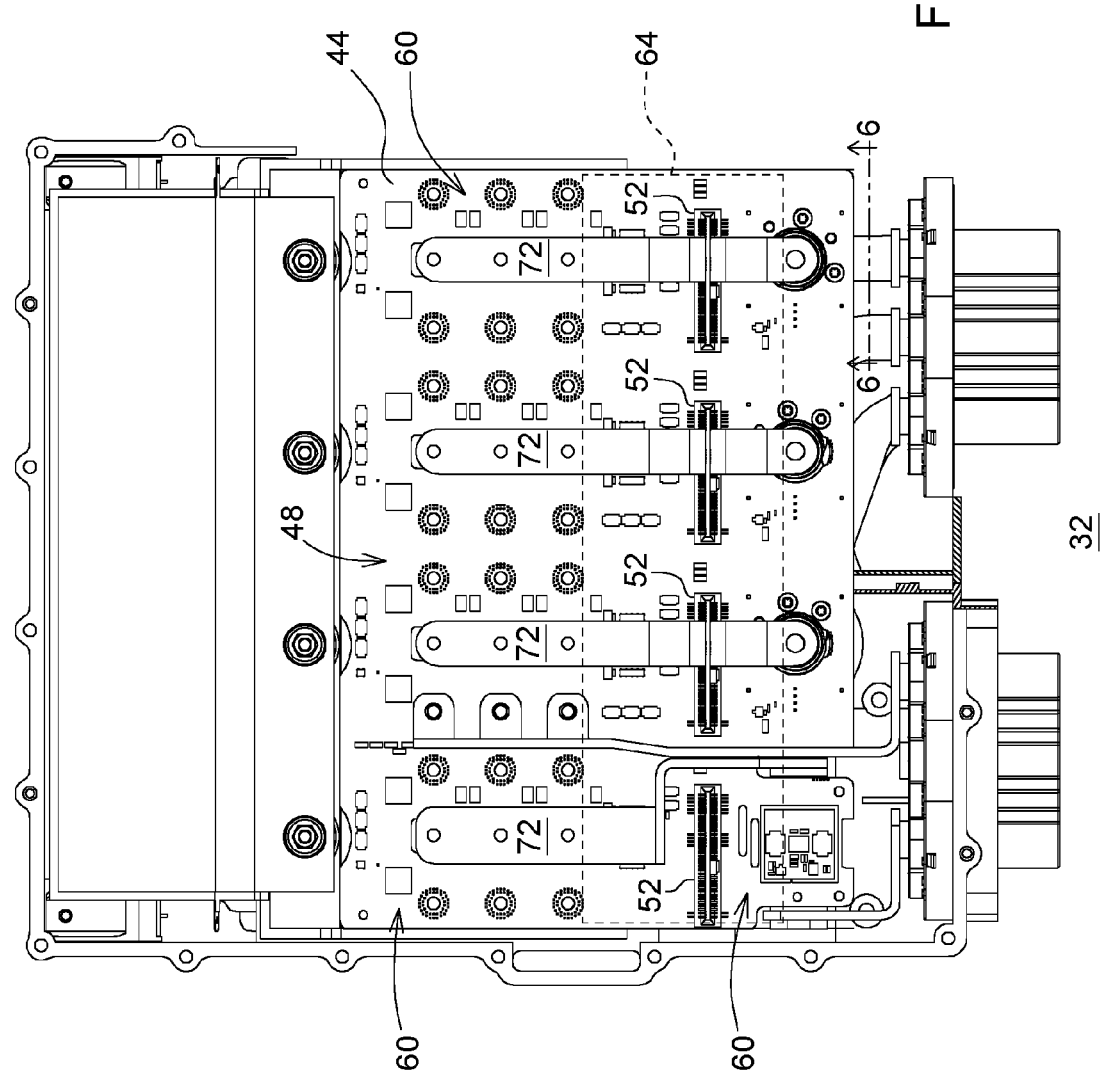
FIG. 4 is a plan view of the first circuit board of the electronic inverter assembly as viewed along reference line 4-4 of FIG. 3.

In one embodiment as best illustrated in FIG. 4, the first circuit board 44 has a first zone 64 (e.g., low inductance zone) near or within a maximum conductive trace length on the first circuit board 44 from the first edge connector 52 to minimize inductance provided to the control terminals 40 of the semiconductor switches (36, 38). The conductive traces are composed of metal, alloy or metallic material. Further, the first zone 64 may contain circuits that would otherwise be susceptible to time delay from signal communication outside of the first zone 64. The first zone 64 can include first components 60 mounted on one or both sides of the first circuit board 44.

Figure 5:
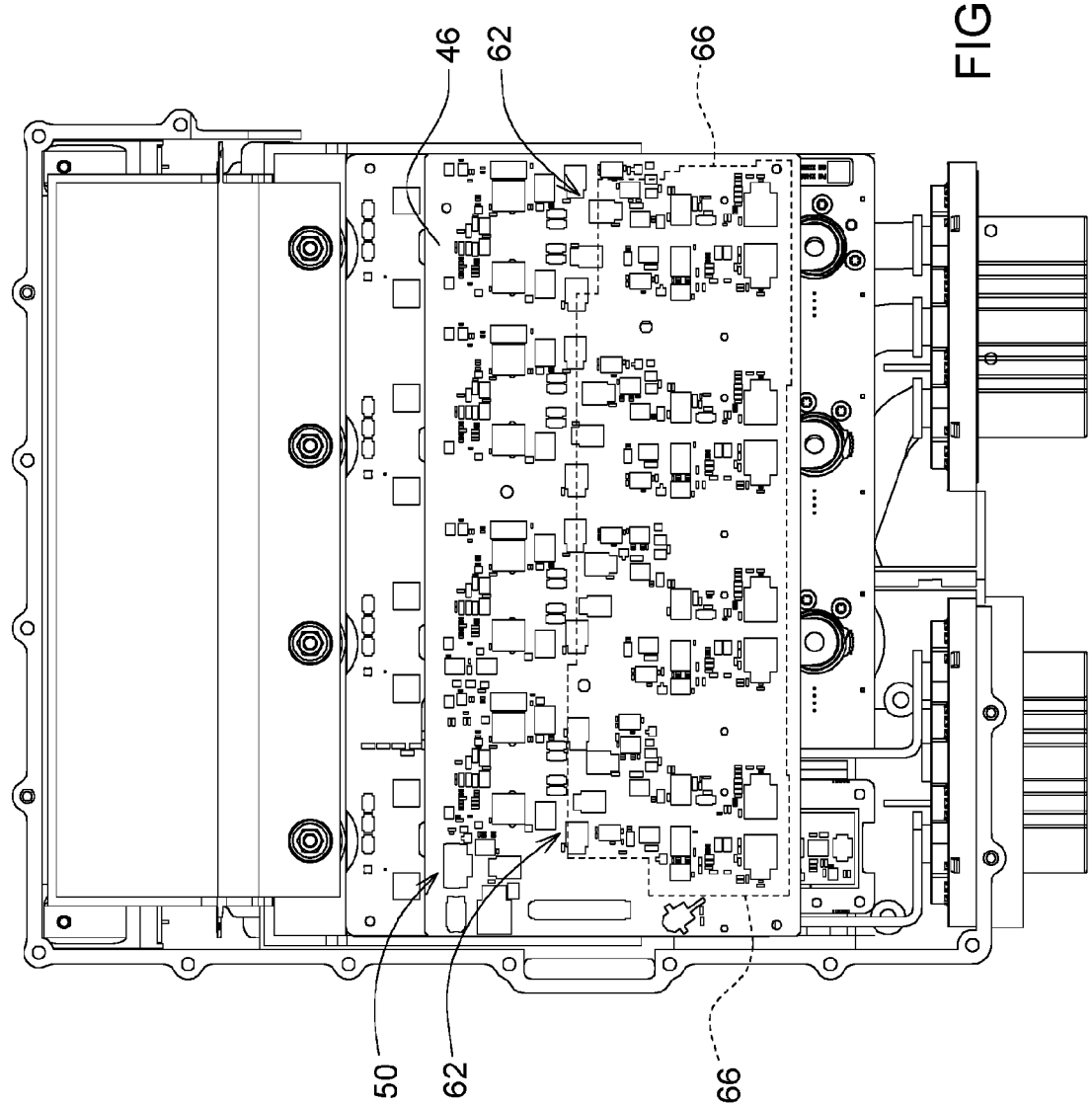
FIG. 5 is a plan view of the second circuit board as viewed along reference line 5-5 of FIG. 2.

In one embodiment as best illustrated in FIG. 5, the second circuit board 46 has a second zone 66 (e.g., low inductance zone) near or within a maximum conductive trace length on the circuit board from the second edge connector 54 to minimize inductance provided to the control terminals 40 of the semiconductor switches. Further, the second zone 66 may contain circuits that would otherwise be susceptible to time delay from signal communication outside of the second zone 66. The second zone 66 can include second components 62 mounted on one or both sides of the second circuit board 46.

In one configuration, conductive traces on the first circuit board 44 and the second circuit board 46 can be surrounded by one or more ground traces or ground planes to avoid loop current. In one embodiment on the first circuit board 44 and the second circuit board 46, conductive trace geometry can be arranged to group and separate conductive traces into three voltage classes: (1) high-voltage power traces/circuit referenced to high-side semiconductor switch 38 (e.g., metal oxide semiconductor field effect transistor (MOSFET)), (2) high-voltage power traces/circuit referenced to low-side semiconductor switch 36 (e.g., MOSFET), and (3) low-voltage power traces/circuit referenced to low-voltage electronics. In particular, the circuit board conductive traces are physically separated for necessary creepage (e.g., from thermal expansion and contraction) and clearance to meet high-voltage safety requirements and to eliminate cross-talk between time critical and performance critical circuits that serve different phases (e.g., three phases plus an optional brake chopper for single inverter) of the electronic inverter assembly 32 or inverter.

If the inverter assembly 32 is a single inverter configuration, the inverter assembly 32 may provide one or more phase output signals, such as alternating current output signals for a first phase, a second phase and a third phase. Further, the inverter assembly 32 may provide an optional fourth phase output as a brake chopper. If the inverter assembly is dual inverter configuration, the inverter assembly 32 further comprises a third circuit board 144 that is similar to the first circuit board 44. The third circuit board 144 can contain a driver circuit to drive one or more switch modules 68 or semiconductor switches (36, 38). The output of the switch modules can be at phase terminals or bus bar terminals. The direct current terminals 71 of the first circuit board 44 and the third circuit board 144 can be interconnected by a coaxial bus connector 145. For a dual inverter configuration, a primary inverter may be used in a motoring mode to control the motor 88, whereas a secondary inverter may be used in a power generation mode to convert alternating current energy into direct current energy, or in a motoring mode to control another motor or auxiliary electric machine.

In one embodiment, the first circuit board 44 is reserved for components (e.g., first components 60), circuits or both that have a first temperature operating range of greater than or approximately equal to 150 degrees Celsius. Similarly, the second circuit board 46 is reserved for components (e.g., second components 62), circuits, or both have a second temperature operating range of between approximately 125 degrees Celsius and approximately 150 degrees Celsius. Accordingly, the driver circuit 49 for the switching semiconductors of the inverter or dual inverter is split or divided into two circuit boards: the first driver portion 48 on the first circuit board 44 and the second driver portion 50 on the second circuit board 46, where the electrical connection and electrical signals communicated between the two circuit boards are subject to sufficiently low inductance. As used herein, approximately shall mean a tolerance of about plus or minus ten percent.

In one embodiment, the electronic inverter assembly 32 may be enclosed in a housing 155 with one or more coolant passages. For example, the high-temperature characteristics of certain semiconductor switches (e.g., SiC and GaN or other wide band gap devices) in inverters, support cooling of the electronic inverter assembly 32 by engine coolant (e.g., water and ethylene glycol) that is shared with or circulated in an internal combustion engine of a vehicle. The use of engine coolant for cooling the electronic inverter assembly 32 allows simplification of the vehicle because a separate dedicated cooling system for inverter can be eliminated. The electronic inverter assembly 32 can share or leverage the coolant pump and radiator of the vehicle for cooling of the electronic circuitry of the inverter assembly 32, for example. Elimination of a dedicated cooling system for inverter can result in a more compact design with a given power density required to support an electric drive system.

Because of the presence of higher ambient temperature close to engine coolant, the first circuit board 44 (e.g., lower circuit board) uses higher temperature components and is placed over switch modules 68 or inverter power module 34. For example, the first circuit board 44 may be positioned above, facing, or adjacent to the ribs or protrusions of the switch modules 68 of the inverter, where the ribs or protrusions are configured to dissipate heat or thermal energy to the ambient air. In one configuration, one or more switch modules 68 may be mounted on or in contact with the first circuit board 44.

Meanwhile, the second circuit board 46 (e.g., upper circuit board) can be designed with the relatively low temperature parts. Interconnections used for electrical connections between first circuit board 44 and the second circuit board 46 must have lowest possible inductance, and different high voltage circuits should not electrically and magnetically interact with each-other to avoid cross-talk and malfunction of gate drive.

If the interface boards 56 are used to connect the first circuit board 44 and the second circuit board 46, the built-in current sensor 76 of the interface board 56 can potentially reduce inverter cost, eliminate a separate connector used for current-sensing circuit, and minimize the size of electronic inverter assembly 32 (e.g., inverter). The interface boards 56, alone or coupled with the first zone 64 and the second zone 66, are well suited for forming low inductance connections for the circuitry of the inverter 32 and miniaturization of the current sensor 76 integrated with the connector assembly.

In one configuration, the driver circuit 49 or driver comprises a high-side driver circuit referenced to a high-side semiconductor switch 38 (e.g., SiC metal oxide semiconductor field effect transistor (MOSFET)), a low-side driver circuit referenced to a low-side semiconductor switch 36 (e.g., SiC metal oxide semiconductor field effect transistor (MOSFET)).

The interface board 56, the first circuit board 44, and the second circuit board 46 comprises a dielectric layer of a polymer, a plastic, a polymer composite, a plastic composite, a fiber reinforced polymer, a fiber reinforced plastic, or a ceramic material. Conductive traces may overlie the dielectric layer on one or both sides of the interface board 56, the first circuit board 44, and the second circuit board 46. The conductive traces are composed of a metal, an alloy or metallic material. In certain embodiments, the conductive traces on opposite sides of any circuit board may be interconnected by conductive vias or conductive through-holes.

In one embodiment, the interface board 56 comprises a current sensor board with an opening 70 for receiving an output phase terminal 72, such as a bus bar or conductor with a rectangular, polygonal or elliptical cross section. The output phase terminal 72 has a cross section (e.g., rectangular cross section) that can pass through the opening 70 or a corresponding slit in the inductor or current-sensing coil 74. Each output phase terminal 72 is configured to output a signal produced by a pair of semiconductor switches or switch module 68. In one configuration, the interface board 56 (e.g., or board that also comprises current-sensing coil) comprises a plurality of conductive traces routed through conductive vias (e.g., metallic plated vias) between two adjacent internal conductive layers of the interface board 56. The above conductive traces form an inductor or a current-sensing coil 74 for inductively coupling the electromagnetic field in the output phase terminal 72 to a corresponding current sensor 76 circuit, such as the circuit of FIG. 10. For example, the coil 74 may comprise a time-varying flux sensing (e.g., TVFS) coil 74 that is electromagnetically coupled to the output phase terminal 72 and this electrically coupled to a current sensor 76 circuit. In one configuration, the coil 74 comprises a series of conductive traces (e.g., metallic traces) that are interconnected with conductive vias (e.g., metal-plated vias or through-holes) between two adjacent layers of interface board 56.

The current sensor 76 can operate at the first temperature range, the second temperature range, or intermediate temperature ranges between the first temperature range and the second temperature range. The current sensor 76 has a bandwidth of sufficient frequency range to support a target sampling rate for accurate and timely current measurements in real time as the electronic inverter assembly 32 operates to control one or more motors 88, or to convert alternating current into direct current.

Figure 10:
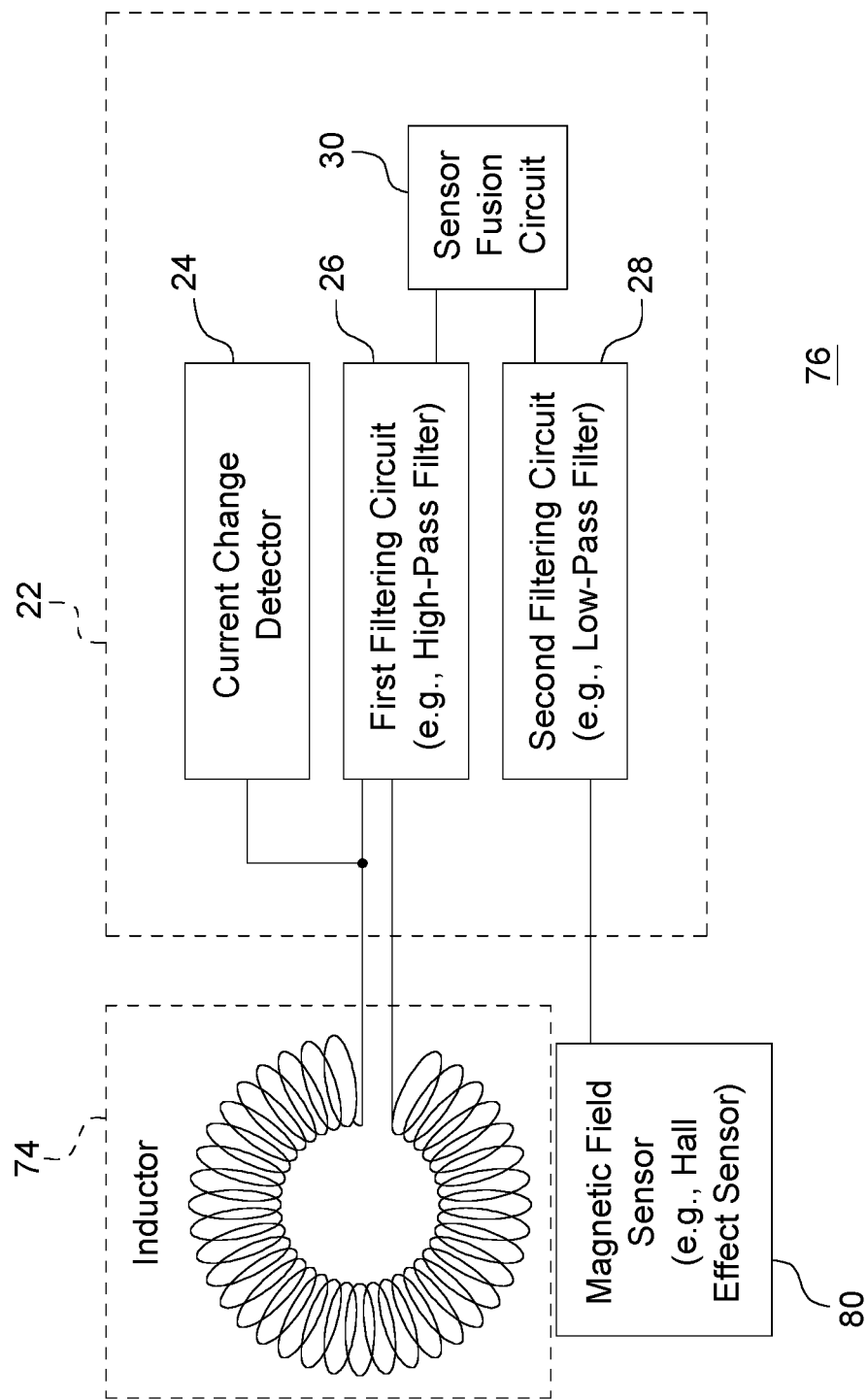
FIG. 10 is a block diagram of illustrative current-sensing circuit.

In accordance with FIG. 10, in one configuration, the current sensor 76 comprises one or more of the following: (1) primary current sensor of conductive traces of the coil 74, (2) secondary current sensor of a magnetic field sensor 80 (e.g., Hall effect sensor) overlying at least a portion of the output phase terminal 72, and (3) secondary current sensor of a magnetic field sensor 80 and one or more flux concentrators 78 on opposite sides of the magnetic field sensor 80.

In the current sensor, the primary current sensor can have a plurality of conductive traces, on the interface board 56, that form an inductor or a current-sensing coil 74 for inductively coupling the current in the output phase terminal 72 to a current sensor 76. A secondary current sensor is associated with the output phase terminal 72. For instance, the secondary current sensor 76 comprises a magnetic field sensor 80 mounted on or near the output phase terminal 72. One or more flux concentrators 78 are disposed laterally with respect to the magnetic field sensor 80.

A sensor processing circuit 22 can convert the sensed magnetic field into a respective current signal or digital representation of the current signal. The current sensor 76 can use ferrous metal shielding or filtering (e.g., ferrite core coils or ferrite beads) to eliminate electromagnetic cross-talk and interaction among inverter phases including the optional brake chopper unit. In the sensor processing circuit 22, the first sensed current from the coil 74 is fused or combined with a second sensed current from the magnetic field sensor 80, wherein the coil 74 comprises a time-varying flux sensing coil 74.

Figure 6:
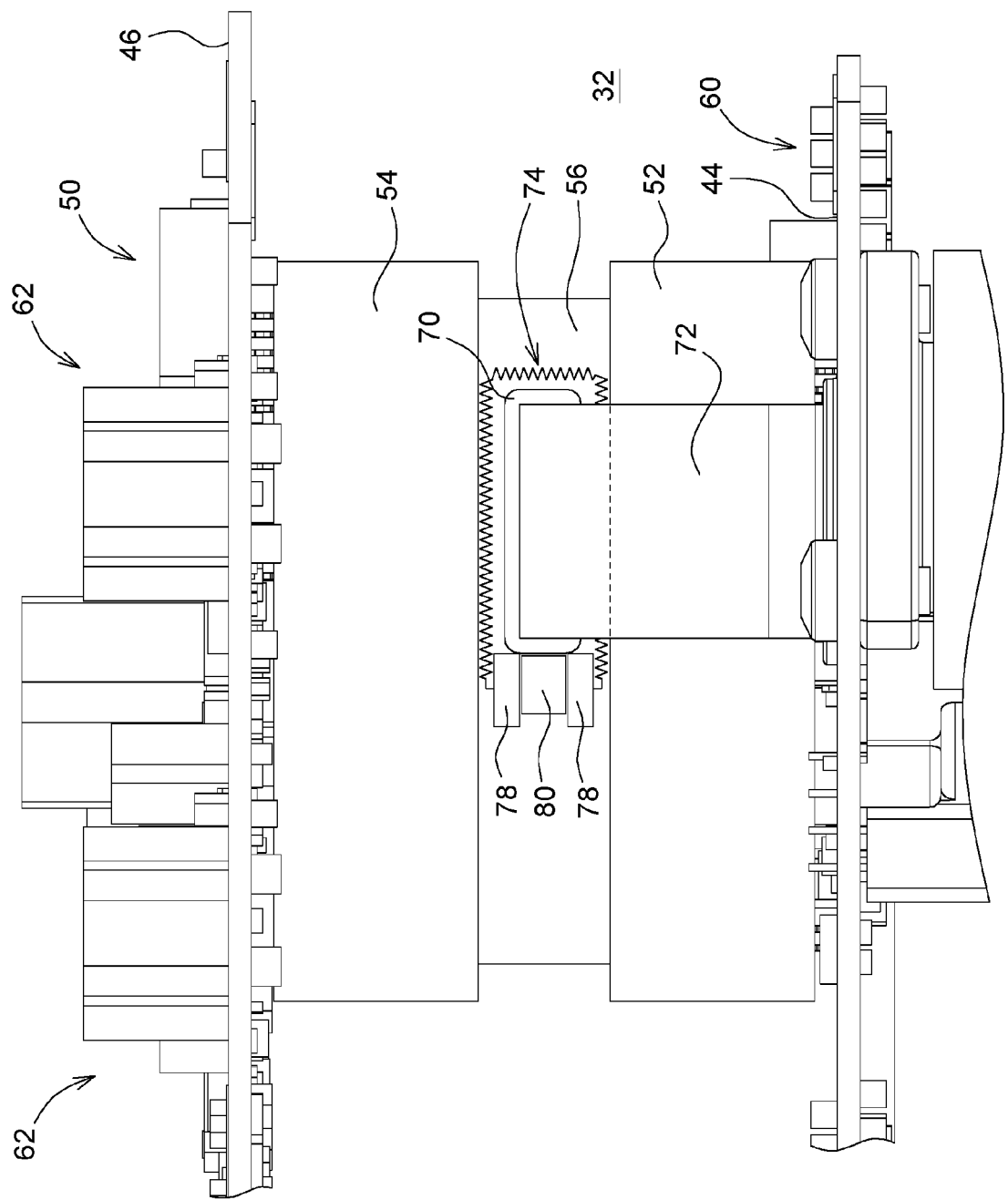
FIG. 6 is a side view of the electronic inverter assembly as viewed along reference line 6-6 of FIG. 2, where the first circuit board and the second circuit board are cut-away to show a close-up view of the inverter assembly.
Figure 7:
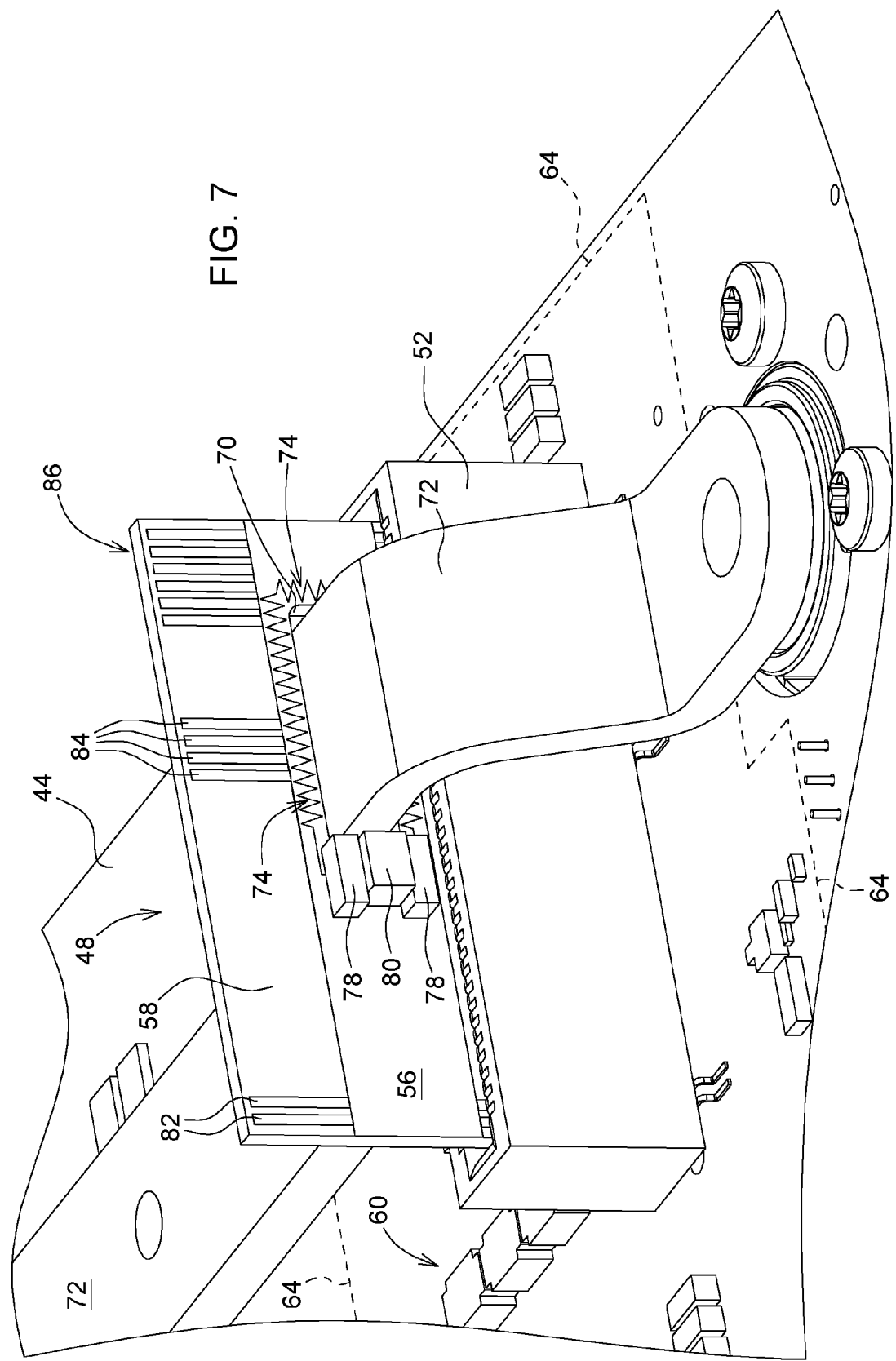
FIG. 7 is a perspective view of the electronic inverter assembly that is similar FIG. 6, except the second circuit board is removed.

In accordance with FIG. 6 and FIG. 7, for each phase the magnetic field sensor 80 is mounted on a respective interface board 56. Further, the magnetic field sensor 80 (e.g., Hall effect sensor) is surrounded by flux concentrators, or electromagnetic field concentrators to direct or focus the electromagnetic field produced by the electrical current in the output phase terminal 72 toward the magnetic field sensor 80 for detection thereby.

Figure 8:
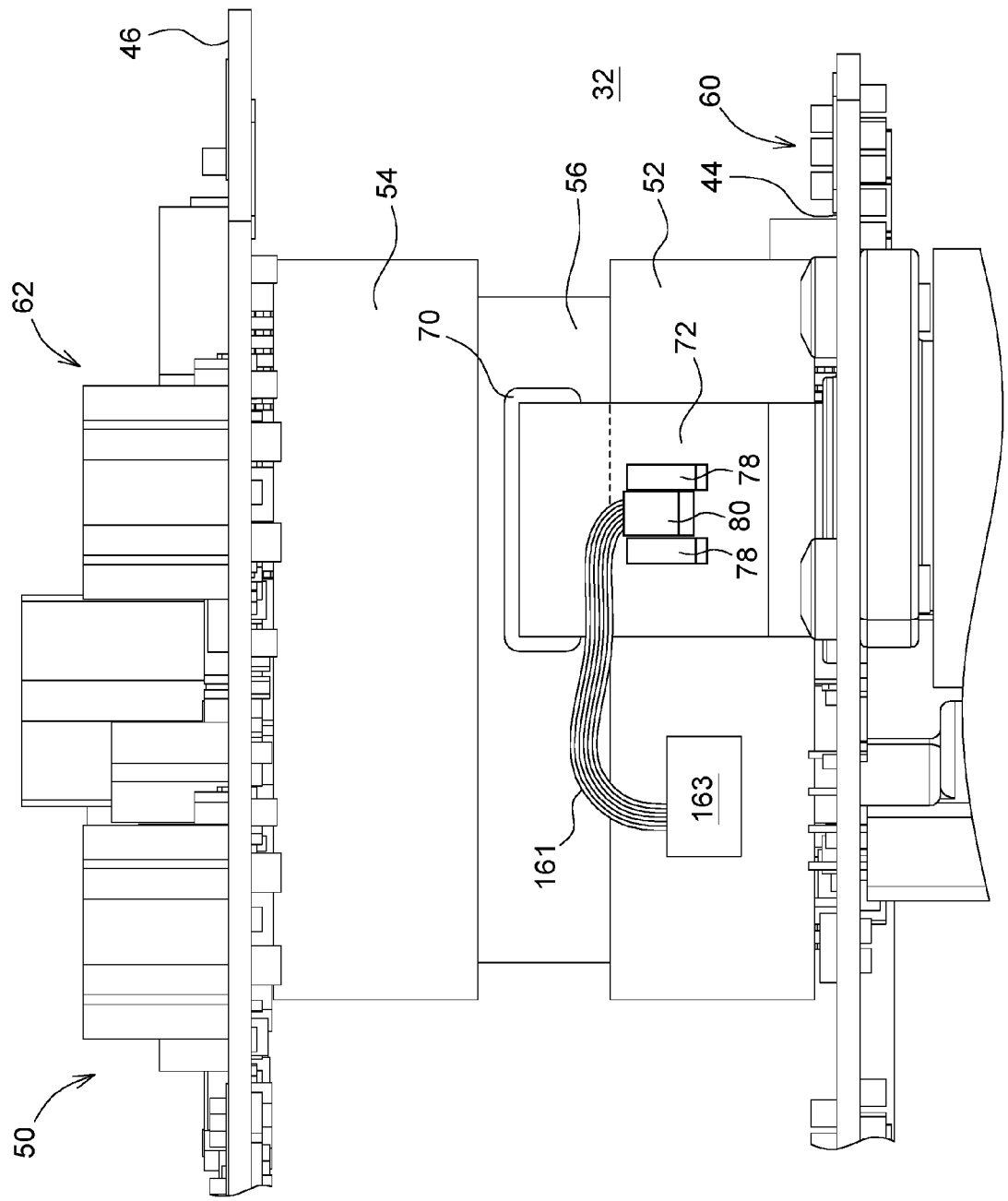
FIG. 8 is an alternate embodiment of the side view of the electronic inverter assembly, which can be compared or contrasted to the side view of FIG. 6.
Figure 9:
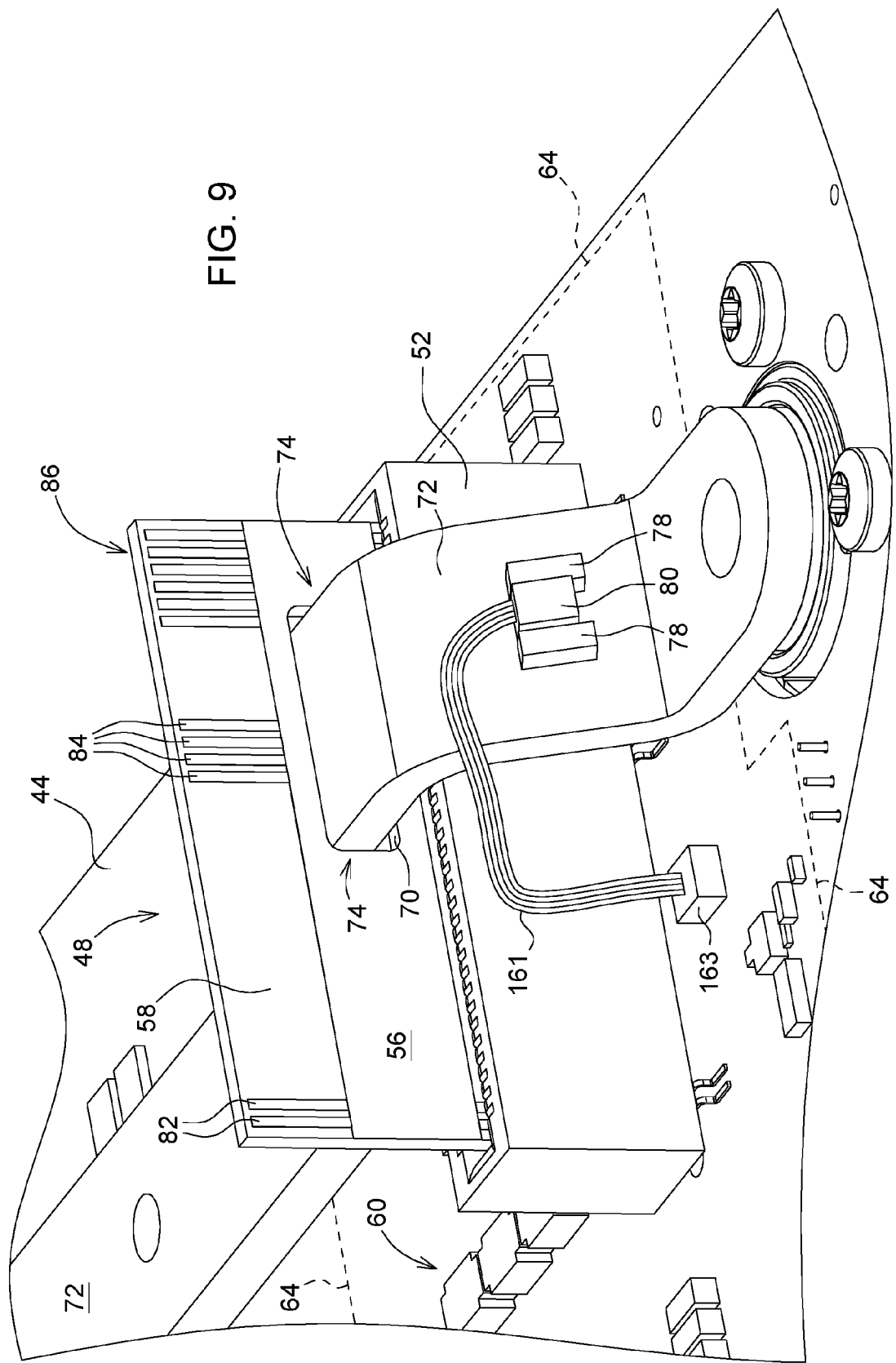
FIG. 9 is an alternate embodiment of a perspective view of the electronic inverter assembly that is similar to FIG. 8, except the second circuit board is removed.

In accordance with FIG. 8 and FIG. 9, a multi-conductor cable (e.g., ribbon cable) 161 or transmission line terminates in a multi-conductor connector 163 at a first end and is electrically connected to the secondary current sensor 76 or magnetic field sensor 80 at the second end. The multi-conductor connector 163 may be mounted on the first circuit board 44 or otherwise electrically connected to the current sensor 76. The multi-conductor cable 161 is arranged for connecting to secondary current sensor 76 (e.g., the magnetic field sensor 80) to provide the signals to signal processing circuit, such as that illustrated in the block diagram of FIG. 10. As illustrated, for each phase of the inverter, the magnetic field sensor 80 is mounted on or overlies the output phase terminal 72.

In one embodiment, the first circuit board 44 has first set of first edge connectors 52 on the first inner side 152; the second circuit board 46 has a second set of second edge connectors 54 on the second inner side 153. A set of interface boards 56 is arranged or adapted for interconnecting the first driver portion 48 and the second driver portion 50. As illustrated in the drawings, each interface board 56 handles or services one phase of the inverter, although in alternate embodiments an interface board may service multiple phases of the inverter. The interface board 56 supports low inductance connections for the input signals (e.g., driver control signals) to the control terminals 40 of the semiconductor switches of one or more switch modules 68, where the input signals are generated by the first components 60 and the second components 62, collectively.

As illustrated in FIG. 7, the first edge connectors 52 comprise three sets of traces. As illustrated in FIG. 7, the first set of traces 82 (e.g., left-most traces) are conductors to communicate or pass through the current sensor 76 signals between the first circuit board 44 and the second circuit board 46, or between the first driver portion 48 and the second driver portion 50; the second set of traces 84 (e.g., center traces) are for signaling of the high-side semiconductor switch 38 in a respective switch module 68, and the third set of traces 86 (right-most traces) are for signaling the low-side semiconductor switch 36 in a respective switch modules 68. Further, the third set of traces 86 can include ancillary or supplemental traces for carrying additional signals, such as, temperature of power semiconductor module 68.

The coil 74 is located radially outward from the output phase terminal 72 and may be formed of wire windings, insulated conductors, or circuit traces on one or more sides of the dielectric substrate of the interface board 56.

Figure 2:
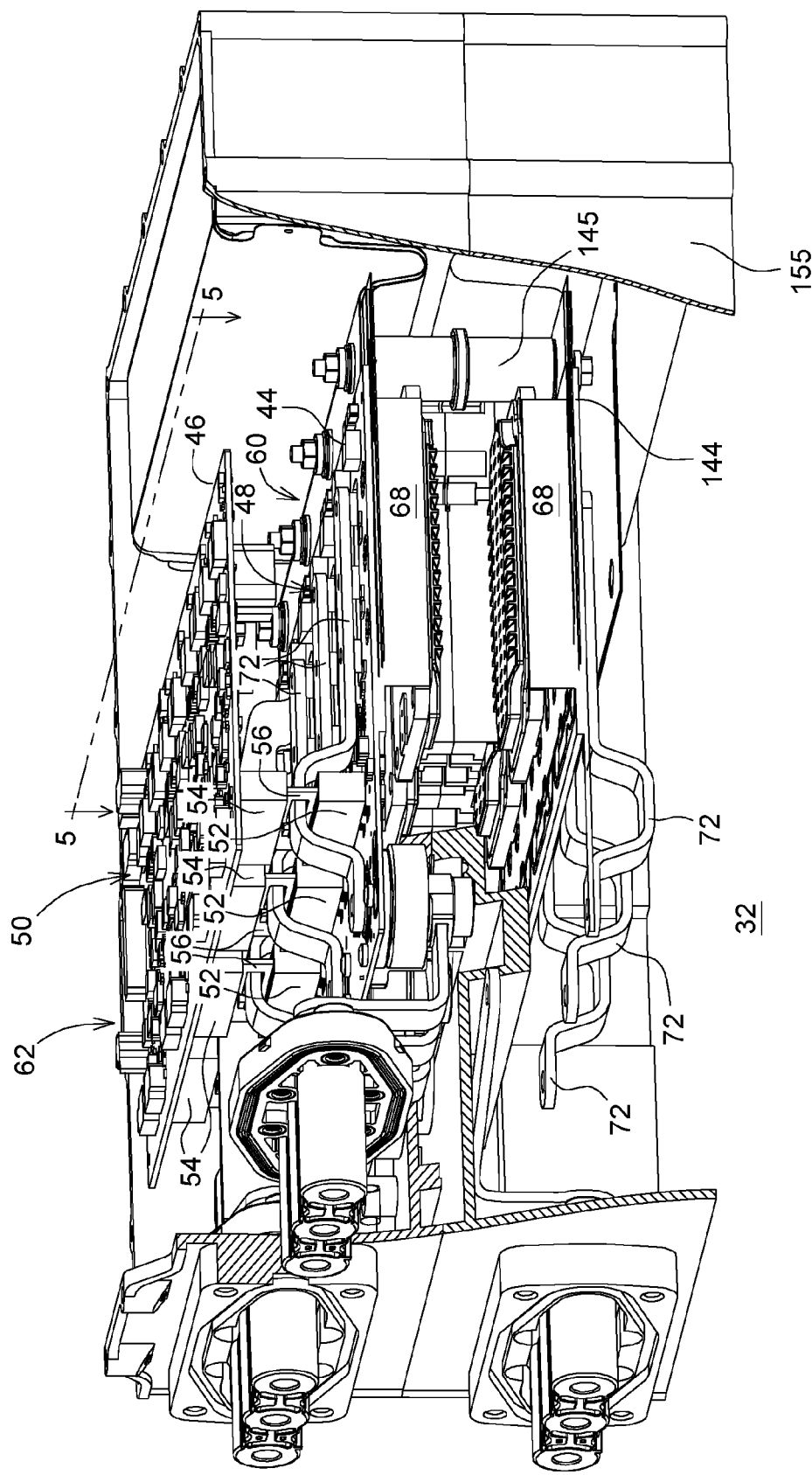
FIG. 2 is a perspective view of the electronic inverter assembly of FIG. 1.
Figure 3:
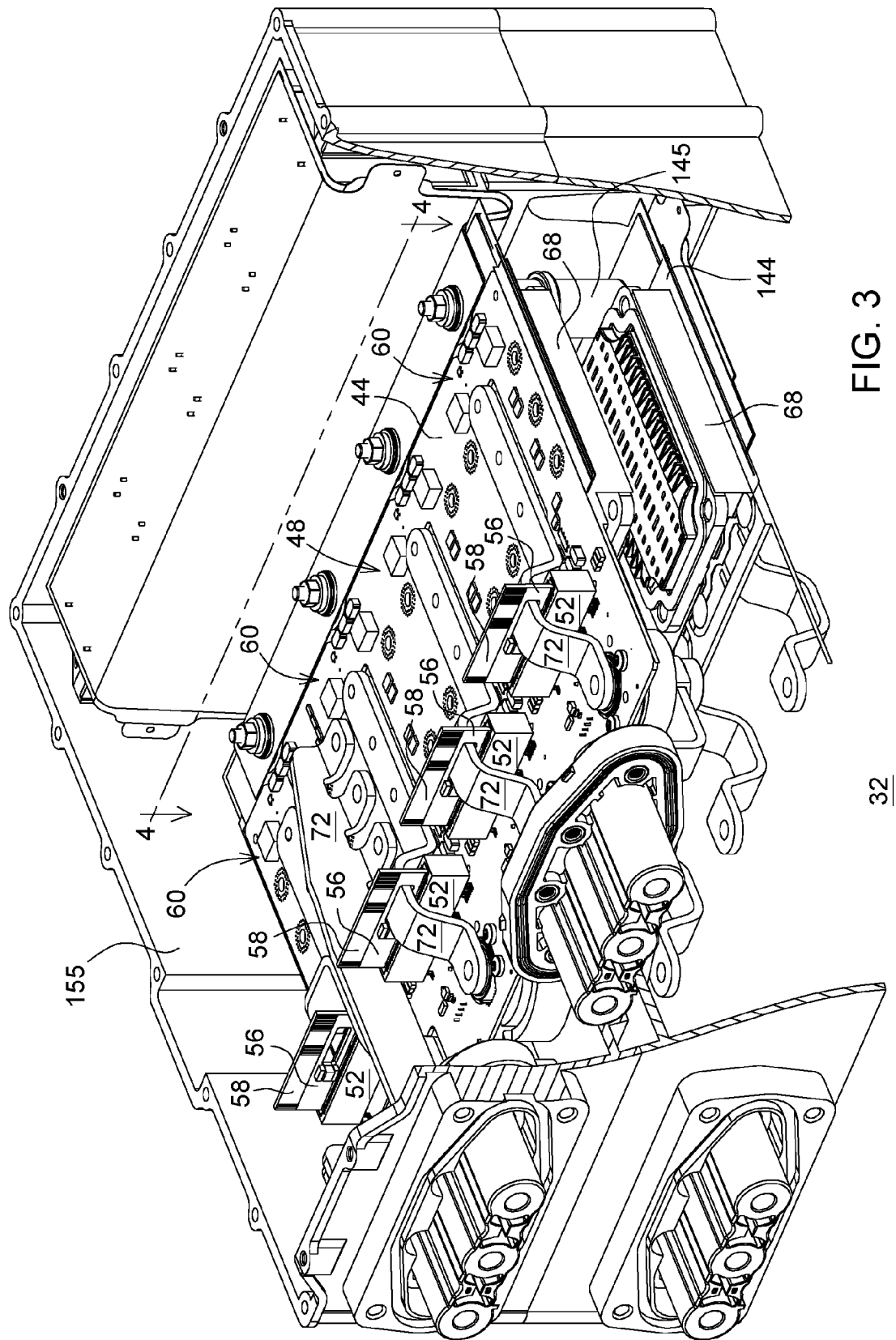
FIG. 3 is another perspective of the electronic inverter assembly of FIG. 1, where a second circuit board is removed to reveal the first circuit board.
Figure 11:
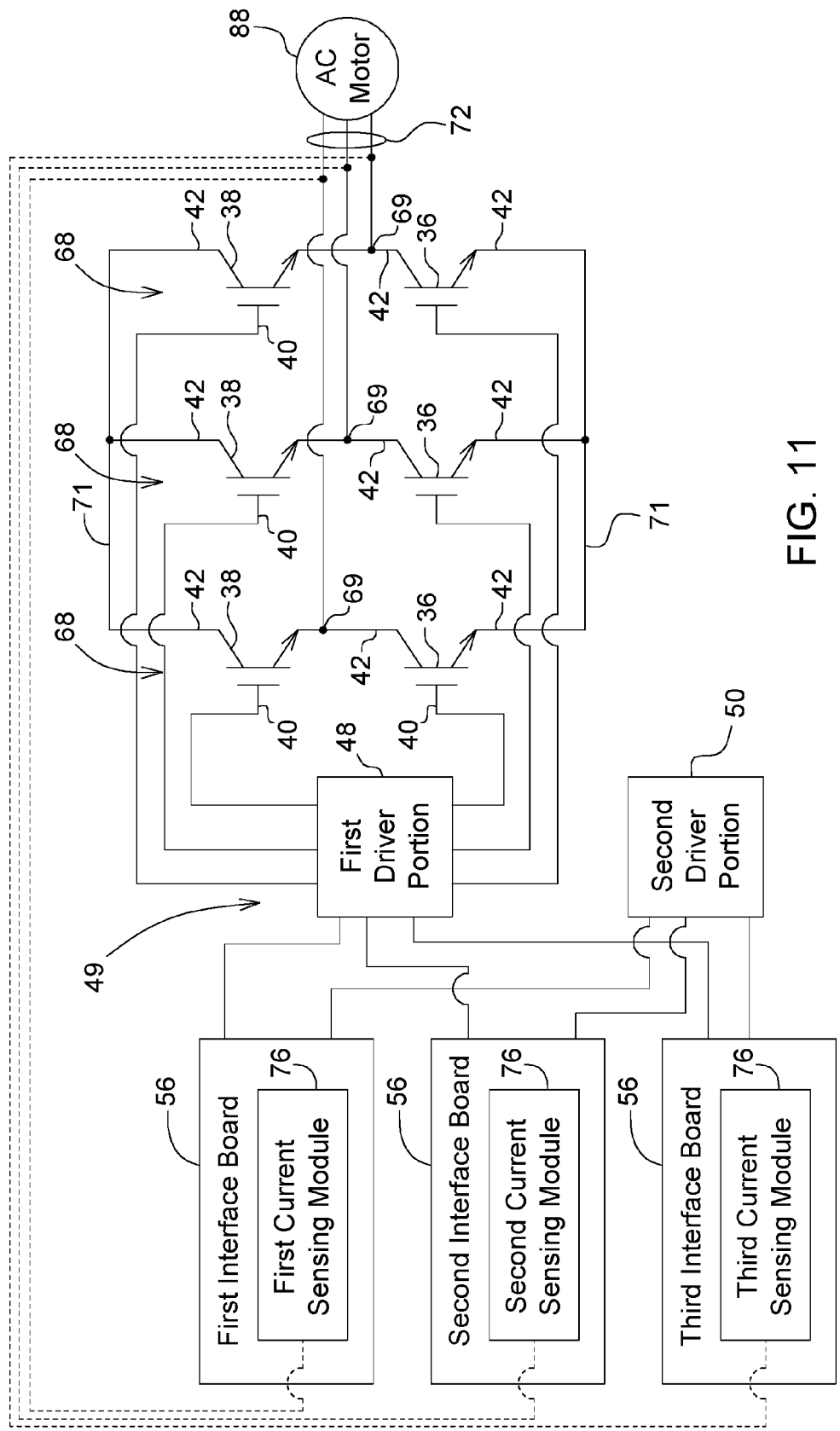
FIG. 11 is a block diagram of the electronic inverter assembly consistent with FIG. 1 through FIG. 7, which omits an optional brake chopping switch module for explanatory purposes.

In one configuration, the semiconductor switches (36, 38) comprise silicon carbide (SiC) or gallium (GaN) nitride switches or transistors. As illustrated in FIG. 1, FIG. 2 and FIG. 11, each phase may be packaged as a separate switch module 68 comprising a low-side switch 36 and high-side switch 38 with ones of the switched terminals 42 coupled together at a phase output node 69 and others of the switched terminals 42 coupled between the terminals of the direct current bus 71. For example, three switch modules 68 may be used for a three phase inverter, or four switch modules 68 may be used for a three phase inverter with the fourth switch module 68 is used for a brake chopper to provide regenerative energy to charge an energy storage device, such as a battery. Meanwhile, the switch module 68 has control terminals 40 of the high-side switch 38 and the low side switch 36 for receiving input signals or control signals from the driver 49, which resides on the first circuit board 44 and the second circuit board 46. Each phase has an output node 69 that is coupled to an electric motor 88.

In one embodiment, if the semiconductor switches (36, 38) comprise bipolar junction transistors or insulated gate bipolar junction transistors the switched terminals 42 comprise an emitter and a collector and the control terminal 40 comprises a base or gate. Analogously, if the semiconductor switches (36, 38) comprise field effect transistors, the switched terminals 42 comprise a source and drain and the control terminal 40 comprises a gate.

In one embodiment, the inverter power module 34 comprises a dual inverter having a primary inverter (e.g., of three phases plus a brake chopper phase) and a secondary inverter (e.g., of three phases only), where the primary inverter is mounted on a primary substrate that faces a secondary inverter mounted on a secondary substrate. The primary inverter 400 may be spaced apart from the secondary inverter 402. For example, the primary substrate of the primary inverter 400 may be spaced apart and generally parallel to the secondary substrate of the secondary inverter 402.

FIG. 10 is a block diagram of a current-sensing circuit. Here, in FIG. 1 magnetic field sensor 80 senses at least a direct current signal component of the observed signal in the conductor or output phase terminal 72.

Alternately, the magnetic field sensor 80 senses a direct current signal component and a lower frequency signal component (or second alternating signal component) of the alternating current signal in the conductor or output phase terminal 72. The second alternating signal component is lower in frequency than the first alternating signal component.

The current sensor 76 comprises circuitry 22 or low voltage electronics. For example, the circuitry 22 has a first filtering circuit 26 and a second filtering circuit 28 that are coupled to a sensor fusion circuit 30. As illustrated, the circuitry 22 further comprises a current change detector 24 that is capable of receiving an alternating current signal from the inductor or current-sensing coil 74.

A first filtering circuit 26 has a high-pass filter response. The first filtering circuit 26 is coupled to the inductor 74 to provide a filtered alternating current signal component (e.g., first alternating signal component). A second filtering circuit 28 has a low-pass filter response. The second filtering circuit 28 coupled to the magnetic field sensor 80 to provide: (1) a filtered direct current signal component, (2) a lower frequency alternating signal component (e.g., second alternating signal component), or both.

In one embodiment, a sensor fusion circuit 30 determines an aggregate sensed current (e.g., in the output phase terminal 72) based on the filtered alternating current signal component and the filtered direct current signal component. The aggregate sensed current (e.g., in each output phase terminal 72) refers to the combined current that includes contributions of the direct current signal components and alternating signal components.

The electronic inverter assembly 32 is well suited for reducing cost by limiting or minimizing the components that need to operate at the first temperature range. The electronic inverter assembly 32 can facilitate or leverage the use of engine coolant for cooling the electronic inverter at target power densities, such power densities per volume as greater than approximately 25 kW/L (kilowatt per liter). By minimizing inductances and maintaining inductances to less than approximately four nH (nano-Henries) for control signals to the control terminals 40 of the semiconductor switches (36, 38), electronic inverter tends to promote precise timing of control signals produced by the driver to maintain proper phase relationships of the output signal outputted by the inverter phases. For example, components can be placed close to the edge connector to minimize inductance and ensure that critical circuits don't encounter inductances greater than approximately four nH. The electronic inverter assembly 32 can be configured as a higher-power density Silicon Carbide (SiC) inverter that are cooled by engine coolant.

In FIG. 11, the inverter assembly comprises a first interface board 56 for a first phase, a second interface board 56 for a second phase and a third interface board 56 for a third phase that provide electrical and mechanical connections between the first driver portion 48 of the first circuit board 44 and the second driver portion 50 of the second circuit board 46. Each interface board 56 is associated with a current sensor 76 or current-sensing module. For example, the first interface board 56 is associated with a first current sensor 76 for sensing electrical current in the first output phase terminal 72 of the first phase; the second interface board 56 is associated with a second current sensor 76 for sensing electrical current in the second output phase terminal 72 of the second phase; the third interface board 56 is associated with a third current sensor 76 for sensing electrical current in the third output phase terminal 72 of the third phase. The driver 49 comprises the first driver portion 48 and the second driver portion 50 collectively that provide control signals to the control inputs 40 of the semiconductor switches (36, 38) for each phase. In FIG. 11, the dashed lines between each interface board 56 or the current sensor 76 represent inductive coupling between the output phase terminals (72) that are coupled to the motor 88 or electric machine.

Figure 12:
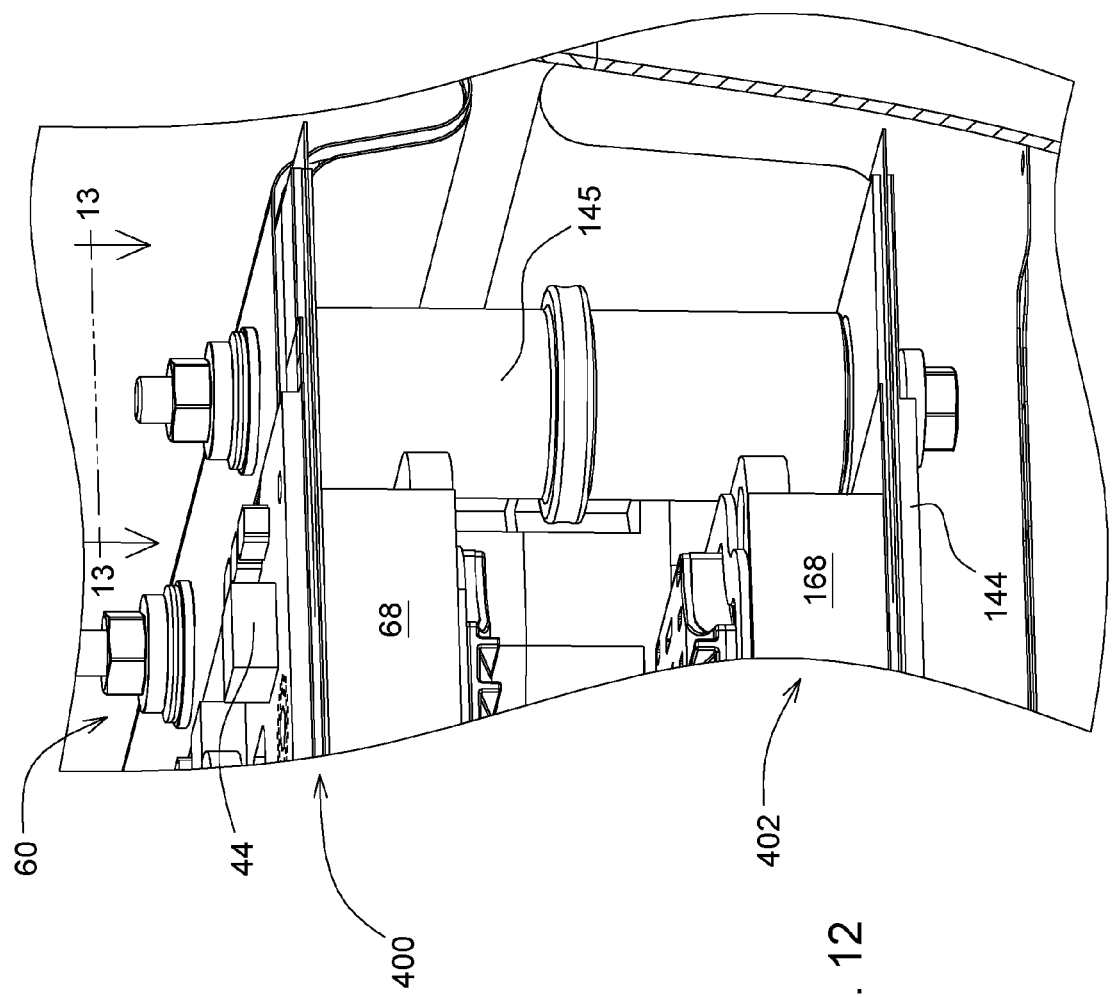
FIG. 12 illustrates a perspective view of the rectangular region 12 of FIG. 2 in greater detail.

FIG. 12 illustrates a perspective view of the rectangular region 12 of FIG. 2 in greater detail. Like reference numbers in FIG. 2 and FIG. 12 indicate like elements. Consistent with FIG. 12, FIG. 13, and FIG. 14, the coaxial bus connector 145 comprises a coaxial bus bar (e.g., with an integral snubber capacitor) that connects the direct current terminals of the primary inverter 400 and the secondary inverter 402, such as the positive direct current terminal 453 of the primary inverter 400 to the respective positive direct current terminal 451 of the secondary inverter 402. Further, the coaxial bus connector 145 can comprise a coaxial bus bar that connects the negative direct current terminal 454 of the primary inverter 400 to the negative direct current terminal 452 of the secondary inverter 402.

Figure 13:
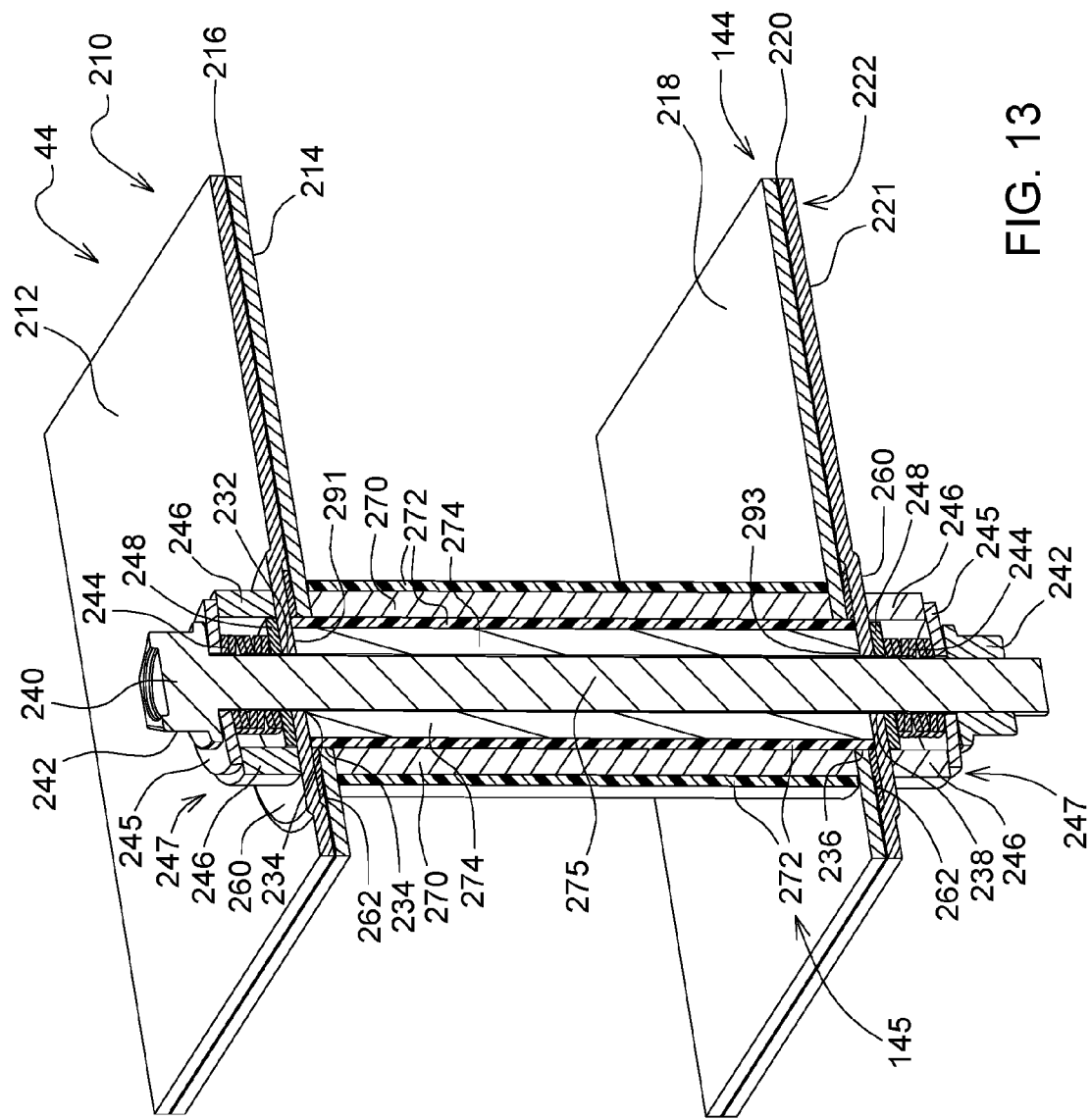
FIG. 13 shows a cross section of the coaxial bus connector of FIG. 12 along reference line 13-13.

FIG. 13 shows a cross section of the coaxial bus connector of FIG. 12 along reference line 13-13. Like reference numbers in FIG. 2, FIG. 12 and FIG. 13 indicate like elements.

Figure 14:
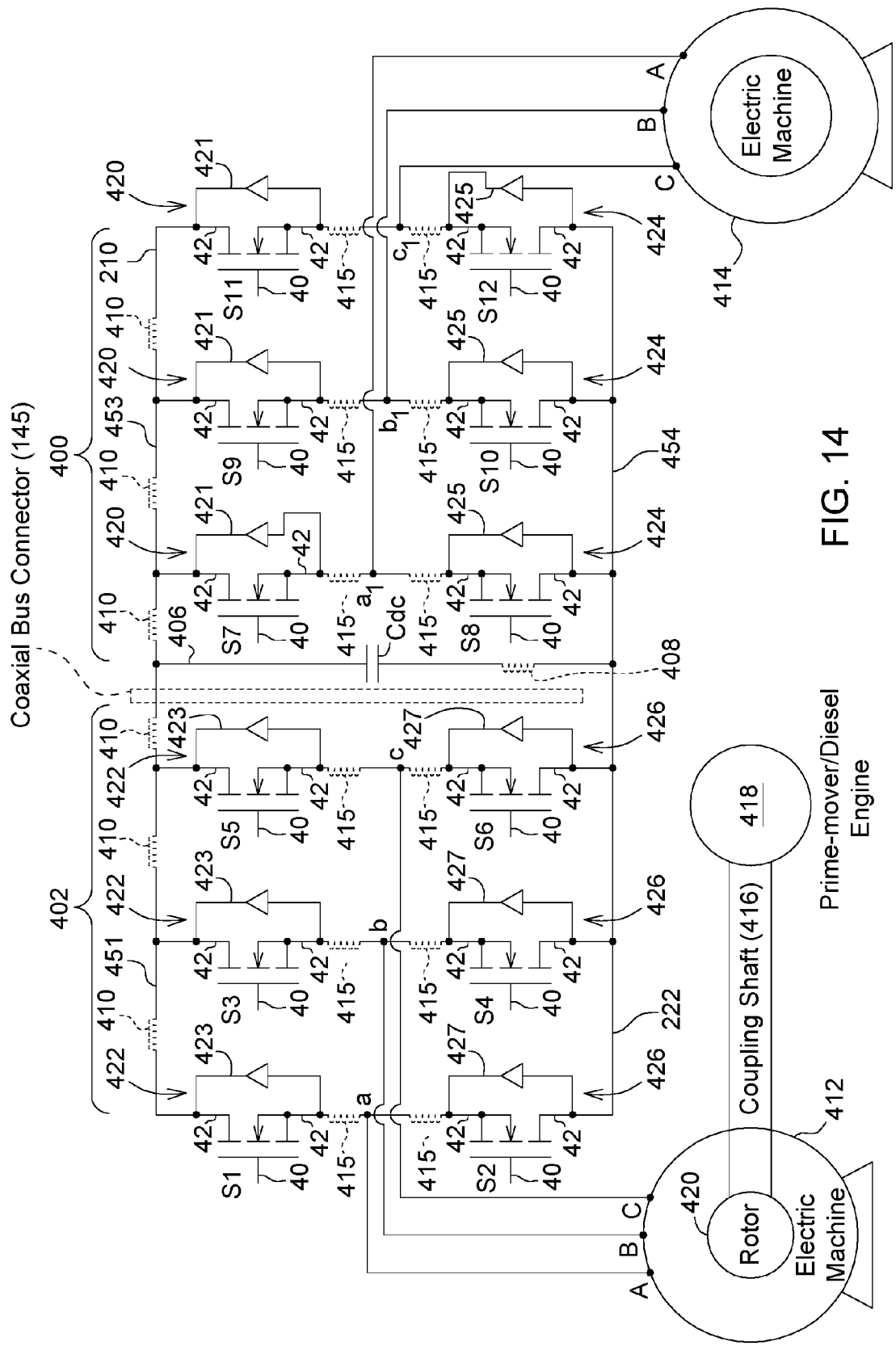
FIG. 14 shows a schematic of a dual inverter with parasitic inductances and a coaxial bus connector with a compensating capacitance.

FIG. 14 shows a schematic of the dual inverter (400, 402) with parasitic inductances (408, 410, 415) and a coaxial bus connector 145 with compensating capacitance to compensate for one or more parasitic inductances. As shown in FIG. 14, the parasitic inductances (408, 410, 415) are indicated by inductor symbols with dashed lines because the parasitic inductances do not represent discrete circuit elements, coils or inductors, but rather an equivalent model of the circuitry associated with the dual inverter (400, 402) or its electrical connections.

The first parasitic inductance 408 represents an inductance of the direct current bus capacitor 406. For example, the first parasitic inductance 408 (e.g., approximately 20 nano-Henries (nH) or greater) of the direct current bus capacitor 406 may be associated with leads or terminals that connect a network, group or bank of capacitors together to form a bulk capacitor.

The second parasitic inductance 410 represents an inductance or leakage inductance between the switched terminals 42 of each switching device (420, 424, 422, 426) or switch modules (68, 168) to the terminals of the direct current bus (210, 222) for each phase. As illustrated in FIG. 14, the leakage inductance can be modeled as a leakage inductance associated with the drain or collector, or other switched terminals 42 of the high-side semiconductor switch (420, 422). The leakage inductances or second parasitic inductances 410 tend to cause voltage spikes during switching of the semiconductor switches (e.g., high-side semiconductor switches 420, 422), such as voltage spike on the drain terminal that can reduce the longevity of the semiconductor switch (420, 422).

The third parasitic inductance 415 represents a source inductance (e.g., approximately 5 nH to 20 nH) associated with one or more of the following: (1) semiconductor packaging (e.g., conductors or leads) of the source, emitter or other switched terminals 42 of each semiconductor switch (420, 422, 424, 426) and (2) the associated traces on the circuit board (44, 144) or/and substrate on which the semiconductor switch is mounted. When the semiconductor switch (420, 422, 424, 426) is turned off the source inductance or parasitic inductance causes the switch to continue conducting, which can limit the maximum switching speed of the semiconductor switch or result in ripple or fluctuation of the direct current bus voltage unless a snubber capacitor is used to compensate, such as the integral snubber capacitor associated with the coaxial bus connector 145. The integral snubber capacitor is generally configured to be in parallel with the direct current bus capacitor 406 and connected between the direct current terminals (210, 222).

In FIG. 13, the electronic inverter assembly (e.g., dual inverter 400, 402) comprises a primary direct current bus 210 and a secondary direct current bus 222, where the primary direct current bus 210 is associated with a first circuit board 44 and where the secondary direct current bus 222 is associated with another circuit board, such as the third circuit board 144. For example, the primary direct current bus 210 is formed of metallic conductive traces or conductive layers (212, 214) overlying a dielectric layer 216 of the first circuit board; the secondary direct current bus 222 is formed of conductive traces or conductive layers (218, 220) overlying a dielectric layer 220 of the third circuit board 144.

The primary direct current bus 210 has a positive terminal 453 and a negative terminal 454, which can be located on the same or opposite sides of the first circuit board 44. As illustrated in FIG. 13 in conjunction with FIG. 14, the positive and negative terminals (453, 454) are located on opposite sides of the first circuit board 44 near the bus connector 145. In one configuration the positive and negative terminals of the primary direct current bus 210 are associated with, electrically connected to, or coextensive with the conductive layers (212, 214).

A primary inverter 400 has a power module 68 that comprises one or more pairs of semiconductor switches (420, 425) mounted on a primary substrate. Each pair of semiconductors comprises a low-side semiconductor switch 424 and a high-side semiconductor switch 420 coupled together between the positive terminal 453 and the negative terminal 454, or between the primary direct current bus 210. Each of the semiconductor switches (420, 425) has a control terminal 40 and switched terminals 42. A high-side protection diode 421 comprises a free-wheeling diode connected to the switched terminals 42 of the high-side switch 420. A low-side protection diode 425 comprises a free-wheeling diode connected to the switched terminals 42 of the low-side switch 424.

The primary inverter 400 has output terminals that are labeled a1, b1, and c1 for a first phase, a second phase and a third phase. The output terminals are coupled to the electric machine 414 (e.g., alternating current motor) though cables, bus bars or other conductors. In one embodiment, the conductors are associated with parasitic inductances that are not compensated for by the snubber capacitor of the bus connector 145.

A secondary direct current bus 222 has a positive terminal 451 and a negative terminal 452, which can be located on the same or opposite sides of the third circuit board 144. As illustrated in FIG. 13 in conjunction with FIG. 14, the positive and negative terminals (451, 452) are located on opposite sides of the third circuit board 144 near the bus connector 145. In one embodiment, the secondary inverter power module 168 comprises one or more pairs of semiconductor switches (422, 426) mounted on a secondary substrate spaced apart and generally parallel to the primary substrate. Similarly, a first circuit board 44 is generally parallel to and spaced apart from the third circuit board 144, where the primary inverter power module 68 may be electrically connected to or mounted on the first circuit board 44 and where the secondary inverter power module 168 may be electrically connected to or mounted on the third circuit board 144. Each pair of semiconductors comprises a low-side semiconductor switch 426 and a high-side semiconductor switch 422 coupled together between the secondary direct current bus 222. Each of the semiconductor switches has a control terminal 40 and switched terminals 42. A high-side protection diode 423 comprises a free-wheeling diode connected to the switched terminals 42 of the high-side switch 422. A low-side protection diode 427 comprises a free-wheeling diode connected to the switched terminals 42 of the low-side switch 426.

The secondary inverter 402 has input terminals that are labeled a, b, and c for a first phase, a second phase and a third phase. The input terminals are coupled to the electric machine 412 (e.g., generator or alternator). The electric machine 412 has a rotor or shaft that is rotated or driven by a prime mover 418, such as an internal combustion engine or a diesel engine.

In one embodiment, the first circuit board 44 is associated with a primary inverter 400 comprising one or more primary inverter modules 68. For example, if the primary inverter 400 comprises a three phase inverter three primary inverter modules 68 may be associated with the first circuit board 44. In an alternate embodiment, the primary inverter 400 comprises three phase inverter with a brake chopper, where four primary inverter modules 68 may be associated with the first circuit board 44.

In one embodiment, the third circuit board 144 is associated with a secondary inverter 402 comprising one or more secondary inverter modules 168. For example, if the secondary inverter 402 comprises a three phase inverter three primary inverter modules 168 may be associated with the third circuit board 144. In an alternate embodiment, the secondary inverter 402 comprises three phase inverter with a brake chopper, four primary inverter modules may be associated with the first circuit board 144.

The primary inverter 400 may operate in one or more of the following operational modes: (1) motoring mode, in which the primary inverter 400 provides one or more alternating current signals (e.g., substantially sinusoidal signals) to drive or control an electric motor, (2) generating mode, in which the primary inverter 400 accepts alternating current electrical energy (e.g., from a generator or alternator that converts mechanical energy into electrical energy), where the primary inverter 400 coverts the alternating current into direct current (e.g., for charging an energy storage device or battery), and (3) regenerative braking mode, in which the primary inverter 400 converts alternating electrical energy into direct current while the electric machine opposes movement of the vehicle during braking. Similarly, the secondary inverter 402 may operate in one or more of the following operational modes: (1) motoring mode, in which the secondary inverter 402 provides one or more alternating current signals (e.g., substantially sinusoidal signals) to drive or control an electric motor, (2) generating mode, in which the secondary inverter 402 accepts alternating current electrical energy (e.g., from a generator or alternator that converts mechanical energy into electrical energy), where the secondary inverter 402 coverts the alternating current into direct current (e.g., for charging an energy storage device or battery), and (3) regenerative braking mode, in which the secondary inverter 402 converts alternating electrical energy into direct current while the electric machine opposes movement of the vehicle during braking. For example, the primary inverter 400 may operate in a motoring mode while the secondary inverter 402 may operate in a generating mode.

A coaxial bus connector 145 has a first end and a second end opposite the first end. The first end has a first positive terminal and a first negative terminal coupled the primary direct current bus 210. The second end has a second positive terminal and a second negative terminal coupled to the secondary direct current bus 222, wherein the coaxial bus connector 145 comprises a dielectric material 272 between a center conductor and a coaxial outer sleeve 270 to form a snubber capacitor to absorb electrical energy or to absorb voltage spikes. The capacitance of the integral snubber capacitor can be adjusted somewhat by the dielectric constant of the dielectric material, the thickness of the dielectric material and the dimensions of the center conductor and coaxial outer sleeve 270, for instance.

In one embodiment, the coaxial bus connector 145 or snubber capacitor can be modeled electrically as capacitor that is in series with or in parallel with a resistor. The coaxial bus connector 145 or snubber capacitor (e.g., integral snubber capacitor of the coaxial bus connector 145) can perform the following functions, separately or cumulatively in accordance with various arrangements. Under a first arrangement, the coaxial bus connector 145 or snubber capacitor is arranged to absorb electrical energy associated with a first parasitic inductance 408 of capacitor connected between the terminals of the primary direct current bus 210, the secondary direct current bus 222, or both. Under a second arrangement, the coaxial bus connector 145 or snubber capacitor is arranged to absorb electrical energy associated with a first parasitic inductance 408 between the direct current bus terminals, which can be associated with a bank, network or group of capacitors that forms the capacitor 406. Under a third arrangement, the coaxial bus connector 145 or snubber capacitor attenuates alternating current signals that would otherwise flow through the capacitor 406 connected between terminals of the primary direct current bus 210, the secondary direct current bus 222, or both. For example, the snubber capacitor is capable of absorbing a high-frequency component (e.g., fundamental frequency, switching frequency or harmonic of fundamental frequency or switching frequency) of current ripple produced in the inverter by one or more semiconductors. Further, the snubber capacitor is capable of absorbing a high-frequency component of current ripple produced in the inverter (e.g., primary inverter 400) in a motoring mode of the electric machine (e.g., 414) coupled to the inverter (e.g., 400).

Under a fourth arrangement, the coaxial bus connector 145 or snubber capacitor is arranged to absorb electrical energy associated with a second parasitic inductance 410 or parasitic inductance of the conductors or bus-bar between switched terminals 42 of a semiconductor switch (420, 424, 422, 426) or switch module (68, 168) and terminals of a bulk direct current bus capacitor 406 comprising a set or bank of capacitors. For example, a second parasitic inductance 410 may be present or modeled for each phase or pair of the semiconductor switches, as illustrated in FIG. 14.

Under a fifth arrangement, the snubber capacitor is integral with the coaxial bus connector 145 and; hence, eliminates the need for a separate or discrete snubber capacitor.

Under a sixth arrangement, the coaxial bus connector 145 provides a capacitance of approximately 1 micro Farads (uF) or higher (e.g., by selection of appropriate dielectric materials and dimensions of the inner and outer conductive sleeves (274, 270)). For example, the coaxial bus connector 145 provides a capacitance of approximately 1 uF or higher with a voltage rating commensurate with the direct current bus of the inverter (400, 402) and a change in voltage with respect to time (dv/dt) rating comparable to a discrete snubber capacitor that is not integral with the direct bus connector.

Under a seventh arrangement, the coaxial bus connector 145 or snubber capacitor is arranged to absorb the third parasitic inductance 415 such as a source inductance or semiconductor packaging inductance of one or more semiconductor switches (420, 424, 422, 426) or switch module (68, 168.

Under an eight arrangement, the coaxial bus connector 145 provides over-voltage protection for the semiconductor switches (420, 422, 424, 426). In accordance with one example, the coaxial bus connector is arranged to suppress over-voltage across one or more semiconductor switches to facilitate an increase in the peak value of the direct current bus voltage. In accordance with another example, the coaxial bus connector is arranged to suppress over-voltage across one or more semiconductor switches to facilitate an increase in the peak current loading of an inverter.

Under one embodiment, the coaxial bus connector 145 is connected between the primary direct current bus 210 of the first circuit board 44, the secondary direct current bus 222 of the third circuit board 144. In one embodiment, the coaxial bus connector 145 comprises an inner sleeve 274, the outer sleeve 270, its or their dielectric layers 272, the fastener 240 (e.g., threaded rod. screw or bolt) and the retainers 242 (e.g., nuts). A connector 255 or coaxial connector portion comprises an inner sleeve 274 that is radially spaced apart from an outer sleeve 270, where the inner sleeve 274 and the outer sleeve 270 or electrically conductive, or formed of metals or alloys.

In one embodiment, the dielectric layer 272 is integral with the inner sleeve 274 or the outer sleeve 270. In an alternate embodiment, the dielectric layer 272 may be a discrete dielectric sleeve that is separate from the inner sleeve 274 and the outer sleeve 270 or bonded by an adhesive to the inner sleeve 274, the outer sleeve 270 or both.

In one configuration, the dielectric layer 272 (e.g. inner dielectric layer) comprises a high temperature dielectric material of high permittivity, where high temperature refers to any temperature equal to or greater than approximately 125 degrees Celsius, or that even approaches approximately 150 degrees Celsius, and where a material of high permittivity comprises material, such as mylar, polyimide, a plastic, or a polymer, with a dielectric constant that is greater than 3 times the dielectric constant of a vacuum or air.

In accordance with one embodiment, the coaxial bus connector 145 for the bus structures (210, 222) relates to a primary direct current bus 210 and a secondary direct current bus 222. A primary direct current bus 210 comprises a first outer conductive layer 212 and a first inner conductive layer 214 separated by a first dielectric layer 216. A first outer hole 232 is in the first outer conductive layer 212; a first inner hole 234 is in the first inner conductive layer 214. In one embodiment, the first outer hole 232 has a first outer radius and the first inner hole 234 has a first inner radius, where the first outer hole 232 has a lesser radius or size than the first inner radius. In particular, the first outer radius of the first outer hole 232 may be of commensurate size to a corresponding radius of a shaft 275 of the fastener 240, whereas the first inner radius may be of commensurate size to receive the corresponding outer radius of the inner sleeve 274 or its outer dielectric layer 272.

A secondary direct current bus 222 comprises a second outer conductive layer 221 and a second inner conductive layer 218 separated by a second dielectric layer 220. A second outer hole 238 is in the second outer conductive layer 221; a second inner hole 236 is in the second inner conductive layer 218. In one embodiment, the second outer hole 238 has a second outer radius and the second inner hole 236 has a second inner radius, where the second outer hole 238 has a lesser radius or size than the second inner radius. In particular, the second outer radius of the second outer hole 238 may be of commensurate size to a corresponding radius of a shaft 275 of the fastener 240, whereas the second inner radius may be of commensurate size to receive the corresponding outer radius of the inner sleeve 274 or its outer dielectric layer 272.

In an alternate embodiment, the primary direct current bus 210, the secondary direct current bus 222, or both may comprise a circuit board, or a printed circuit board (e.g., double-sided circuit board). For example, the primary direct current bus 210 or the secondary direct current bus 222 may use a ceramic substrate, a polymer substrate, a plastic substrate, a fiberglass substrate, or composite substrate as the first dielectric layer 216 or the second dielectric layer 220, respectively. Further, the conductive layers (212, 214, 218, 221) may comprise conductive traces, microstrips, stripline, high-power parallel-plate transmission lines, or ground planes.

An inner sleeve 274 electrically connects the first inner conductive layer 214 to the second inner conductive layer 218. An outer sleeve 270 electrically connects the first outer conductive layer 212 to the second outer conductive layer 221. A fastener 240 extends through the inner sleeve 274 to clamp or compress the first outer conductive layer 212 and the second outer conductive layer 221 toward each other.

In one embodiment, the inner sleeve 274 has an outer dielectric layer 272 such that the inner sleeve 274 is electrically insulated from the outer sleeve 270. For example, the combination of the outer dielectric layer 272, the inner sleeve 274 and the outer sleeve 270 may be modeled as a capacitor or a capacitor connected in series or in parallel with a resistance.

In another embodiment, the inner sleeve 274 has an outer dielectric layer 272 such that the inner sleeve 274 is electrically insulated from the outer sleeve 270 and forms a section of coaxial transmission line for transmitting direct current (DC) signals, low frequency alternating current (AC) signals, or both (simultaneously or at separate discrete times). For instance, the outer sleeve 270 could be grounded, while the direct current signal propagates in the inner sleeve 274 or while an alternating current signal propagates in the region between the inner sleeve 274 and the outer sleeve 270. In one example, the combination of the inner sleeve 274, its outer dielectric layer 272, the outer sleeve 270, its outer dielectric layer 272 comprise the coaxial connector 145 or segment of coaxial transmission line. In another example, the combination of the inner sleeve 274, its outer dielectric layer 272, the outer sleeve 270, its outer dielectric layer 272, the fastener 240 and the retainer 242 comprise the coaxial connector 145 or segment of coaxial transmission line.

In one configuration, one end 291 of the inner sleeve 274 electrically and mechanically contacts the first outer conductive layer 212, and an opposite end 293 of the inner sleeve 274 electrically and mechanically contacts the second outer conductive layer 221. For example, one substantially annular end (291) of the inner sleeve 274 electrically and mechanically contacts a respective substantially annular region of the first outer conductive layer 212, and an opposite substantially annular end (293) of the inner sleeve 274 electrically and mechanically contacts a respective substantially annular region of the second outer conductive layer 221.

Similarly, one end 295 of the outer sleeve 270 electrically and mechanically contacts the first inner conductive layer 214, and an opposite end 297 of the outer sleeve 270 electrically and mechanically contacts the second inner conductive layer 218. For example, one substantially annular end (295) of the outer sleeve 270 electrically and mechanically contacts a respective substantially annular region of the first inner conductive layer 214, and an opposite substantially annular end (297) of the outer sleeve 270 electrically and mechanically contacts a respective substantially annular region of the second inner conductive layer 218.

Having described one or more embodiments in this disclosure, it will become apparent that various modifications can be made without departing from the scope of the invention as defined in the accompanying claims. For example, one or more of any dependent claims set forth in this document may be combined with any independent claim to form any combination of features set forth in the appended claims, and such combination of features in the claims are hereby incorporated by reference into the specification of this document.

The invention claimed is:

1. An electronic inverter assembly, the assembly comprising:
   a primary direct current bus having a positive terminal and a negative terminal;
   a primary inverter power module comprising one or more pairs of semiconductor switches mounted on a primary substrate, each pair of semiconductors comprising a low-side semiconductor switch and a high-side semiconductor switch coupled together between the primary direct current bus, each of the semiconductor switches comprising a control terminal and switched terminals;
   a secondary direct current bus having a positive terminal and a negative terminal;
   a secondary inverter power module comprising one or more pairs of semiconductor switches mounted on a secondary substrate, each pair of semiconductors comprising a low-side semiconductor switch and a high-side semiconductor switch coupled together between the secondary direct current bus, each of the semiconductor switches comprising a control terminal and switched terminals; and
   a coaxial bus connector having a first end and a second end opposite the first end, the first end having a first positive terminal and a first negative terminal coupled the primary direct current bus, the second end having a second positive terminal and a second negative terminal coupled to the secondary direct current bus, wherein the coaxial bus connector comprises a dielectric material between a center conductor and a coaxial sleeve to form a snubber capacitor to absorb electrical energy or to absorb voltage spikes.

2. The electronic inverter assembly according to claim 1 wherein the snubber capacitor can be modeled electrically as capacitor that is in series with or in parallel with a resistor.

3. The electronic inverter assembly according to claim 1 wherein the snubber capacitor is arranged to absorb electrical energy associated with a parasitic inductance of a capacitor connected between the terminals of the primary direct current bus, the secondary direct current bus, or both.

4. The electronic inverter assembly according to claim 1 wherein the snubber capacitor attenuates alternating current signals that would otherwise flow through a capacitor connected between terminals of the primary direct current bus, the secondary direct current bus, or both.

5. The electronic inverter assembly according to claim 1 wherein the snubber capacitor is arranged to absorb electrical energy associated with a parasitic inductance of the conductors or bus-bar between switched terminals of a semiconductor switch or switch module and terminals of a bulk direct current bus capacitor comprising a set or bank of capacitors.

6. The electronic inverter assembly according to claim 1 wherein the snubber capacitor is capable of absorbing a high-frequency component of current ripple produced in the inverter in a motoring mode of the electric machine coupled to the inverter.

7. The electronic inverter assembly according to claim 1 wherein the snubber capacitor is integral with the coaxial bus connector and eliminates the need for a separate or discrete snubber capacitor.

8. The electronic inverter assembly according to claim 1 wherein the coaxial bus connector provides a capacitance of approximately 1 uF or higher with a voltage rating commensurate with the direct current bus of the inverter and a change in voltage with respect to time (dv/dt) rating comparable to a discrete snubber capacitor that is not integral with the direct bus connector.

9. The electronic inverter assembly according to claim 1 wherein the coaxial bus connector provides over-voltage protection for the semiconductor switches.

10. The electronic inverter assembly according to claim 1 wherein the coaxial bus connector is arranged to suppress over-voltage across one or more semiconductor switches to facilitate an increase in the peak value of the direct current bus voltage.

11. The electronic inverter assembly according to claim 1 wherein the coaxial bus connector is arranged to suppress over-voltage across one or more semiconductor switches to facilitate an increase in the peak current loading of an inverter.

* * * * *